United States Patent [19]

Cooper

[11] 4,322,769
[45] Mar. 30, 1982

[54] ELECTRIC SWITCH OPERATION MONITORING CIRCUITRY

[75] Inventor: Evert S. Cooper, Morgan Hill, Calif.

[73] Assignee: International Business Machines Corporation, Armonk, N.Y.

[21] Appl. No.: 219,080

[22] Filed: Dec. 22, 1980

[51] Int. Cl.³ ............................................. G08B 21/00
[52] U.S. Cl. ........................................ 361/88; 340/644
[58] Field of Search .................. 361/88; 307/151, 254, 307/270; 363/55, 56, 57, 58; 340/638, 644, 650, 520

[56] References Cited

U.S. PATENT DOCUMENTS

| | | | |
|---|---|---|---|
| 3,872,473 | 3/1975 | Melgaard et al. | 340/644 X |
| 3,965,469 | 6/1976 | Ryan | 340/644 X |
| 3,976,932 | 8/1976 | Collins | 307/254 X |
| 3,999,175 | 12/1976 | Thibodeau | 340/644 |
| 4,134,025 | 1/1979 | Levin | 340/644 X |

Primary Examiner—Reinhard J. Eisenzopf
Attorney, Agent, or Firm—George E. Roush

[57] ABSTRACT

This switch monitoring circuitry is particularly applicable to switching circuitry for operating a bipolar load device, frequently an inductor, on a source of direct current with four switches arranged to alternate the polarity of potential across the load device in a predetermined periodicity. Such circuitry often is arranged with diode devices individually connected across the switches, especially where the load device is an inductor. The monitoring circuitry specifically described comprises basic logical circuitry having coincidence gating circuits for activating status indicating circuitry; or for controlling associated circuitry for protecting or for compensating the switching circuitry; or for alarming operating personnel of malfunctioning switches.

7 Claims, 3 Drawing Figures

ELECTRIC SWITCH OPERATION MONITORING CIRCUITRY

FIELD

The invention relates to electric switching circuits, and it particularly pertains to circuitry for monitoring electric switch operation, and for signalling for remedial action in case of faulty switch operation.

BACKGROUND

There is a wide variety of electric switching circuits for applications in which the malfunction of the switching arrangements frequently result in serious damage to the principle and/or auxiliary equipment and/or products or processes controlled by those switching circuits.

A pertinent application in point is circuitry commonly used in generating rotating magnetic fields in magnetic bubble storage systems. Here a pair of electromagnets are arranged at right angles to each other. Rising and falling magnetic fields interact to form a rotating magnetic field. Those varying magnetic fields are generated by switching current into and out of the electromagnets. In practice, switching transistors are used. An example of practical circuitry to which the invention is applicable is found in the copending U.S. patent applications Ser. No. 162,294 of Dale Keith Jadus and Richard Owen Seeger, filed on June 23, 1980 for "Current Switch Driving Circuitry", and Ser. No. 162,293 of Fred Andrew Perner and Lionel Daniel Provazek, filed on the same day for "Current Switch Driving Circuit Arrangements". While the reliability of such switching transistors is high, failures do occur, and when they do, serious and sometimes catastrophic losses result.

Efforts have been exerted for detecting the possiblility of such failures and countering the effects that follow. For the most part, these prior art approaches have been too complex, and therefore too costly, and too critical in adjustment for the degree of reliability required.

SUMMARY

In accordance with the invention, the objects indirectly referred to hereinbefore and those that will appear as the specification progresses, obtain in monitoring circuitry for a switching system comprising a circuit having a source of electric current, one switch, a load device, frequently comprising an inductor, and another switch. All of these components are connected in series with a point in the series circuit maintained at a point of fixed reference potential, which monitoring circuitry is connected across the load device and to the point of fixed reference potential for indicating the presence of normal or abnormal potentials in the operation of the system. Essentially the monitoring circuitry is arranged to sample the potentials at the terminals of the load device at predetermined times related to the opening and closing of the switches, and develops currents or potentials indicative of normal or abnormal operation of the switches, which currents or potentials most often are applied to other circuitry for protecting the utilization apparatus or in some instances, for developing compensating currents or potentials.

The monitoring circuitry according to the invention is particularly applicable to switching circuitry for operating a bipolar load device, also frequently an inductor, on a source of direct current with four switches arranged to alternate the polarity of potential across the load device in a predetermined periodicity. Such circuitry often is arranged with diode devices individually connected across the switches, for which switching circuitry the monitoring circuitry specifically described hereinafter is arranged to utilize the diode devices in a clamping manner insofar as the monitoring circuitry is concerned without affecting the normal commutating manner of operation, and especially so where the load device is an inductor as shown and described in the above mentioned copending patent applications.

The embodiment of the monitoring circuitry to be described comprises basic logical circuitry having two effective coincidence gating circuits for activating status indicating circuitry or for controlling associated circuitry for protecting or for compensating the switching circuitry or for alarming operating personnel of malfunctioning switches. One gating circuit comprises three unilateral potential gating input leads, of which two are individually connected to the terminals of the load device and the other is connected to test potential input terminals. This gating circuit has a single output lead connected by way of another unilateral device to a transistor biased for binary off-on action indicative of proper switch operation. The other gating circuit is similar, except for two input leads having transistors with emitter electrodes individually coupled by way of resistance elements to the terminals of the load device, base electrodes supplied with energizing potential and collector electrodes connected in common to the test potential input lead. The output lead of this gating circuit is coupled to another transistor for binary action essentially as that of the other transistor.

PRIOR ART

Prior art electric switch operation monitoring circuitry is determinable on reference to the following U.S. Pat. Nos.

| 3,872,473 | 3/1975  | Melgaard et al | 340/415  |
| 3,965,469 | 6/1976  | Ryan           | 340/415  |
| 3,999,175 | 12/1976 | Thibodeau      | 340/253R |
| 4,134,025 | 1/1979  | Levin          | 307/125  |

The patent to Melgaard and Plapp is directed to a circuit arrangement for monitoring a number of series-connected electric switches for determining which switch is the first to drop out. Were the drop-out indicative of a fault, the arrangement could be used for fault monitoring. The circuit operates on a principal of sensing for an open circuit between electromechanical contacts, which differs from that of the invention which indicates both proper opening and proper closing of switches.

The circuit arrangement disclosed by Ryan does function as a fault detector in that it not only senses for the first switch to open, but for line failure as well. The arrangement is adapted to a digital display annunciator system, and thus differs from the logical circuit arrangement of the invention.

Thibodeau discloses a fault detection and indication system again for series connected switches. In this system, a failure of a switch to open goes undetected because the sensing device is a relay coil connected across the switch terminals. This high current power switching monitor differs from the logical circuit arrangement of the invention.

The patent to Levin is directed to an electric switching monitor for a bipolar electric load such as an electromagnetic load device to which the applicant has turned his attention. The patentee chose to generate two reference potentials and compare them with two operating potentials by means of a pair of comparators which offers a possibility of malfunction, which is not found in the circuitry according to the invention.

DRAWING

In order that the advantages of the invention obtain in practice, the best mode embodiment thereof, given by way of example only, is described in detail hereinafter with reference to the accompanying drawing forming a part of the specification, and in which.

DESCRIPTION

Figure 1:
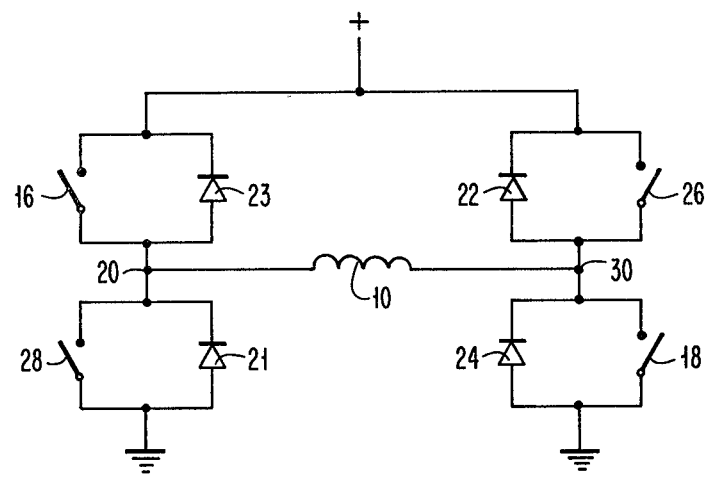
FIG. 1 is a schematic diagram of an example of electric switching circuitry to which the circuitry according to the invention is connected for operation.

An example of electric switching circuitry of interest is shown schematically in FIG. 1. An inductor 10 is switched for generating a component magnetic field by passing direct current through it in opposite directions. First an electric switch 16 is closed for connecting one terminal of the inductor 10 to a source of positive potential, and another electric switch 18 is closed for connecting the other terminal of the inductor 10 to a point of relatively negative potential shown here as ground. The current flowing through the inductor 10 is integrated with respect to time at the rate of E/L where E is the potential across the inductor and L is the inductance thereof. When the desired value of current is reached, the switch 16 is opened. The large sustained inductive kickback produces a potential at the junction 20 that drops to one diode drop below ground as established by a diode 21. With the opening of switch 16, current now passes from ground through the diode 21, the inductor 10, and through the other switch 18 to ground. Because of the low potential, two diode drops, across the inductor 10, the current stored in the inductor decays slowly forming a relatively flat topped plateau of a trapezoidal waveform as shown in FIG. 2, curve 200.

In order to discharge the current flowing through the inductor more rapidly, the switch 18, (FIG. 1) is opened and the potential at the junction 30 immediately rises to one diode drop, that of the diode 22, above the supply potential. The current flowing in the inductor 10 now flows from ground, through the diode 21, the inductor 10, the diode 22 and into the power source. When the current has discharged to zero, all of the energy will have been dissipated and the potentials at the junctions 20 and 30 return to zero potential. The circuit is arranged to pass current through the inductor 10 in the opposite direction by closing switches 26 and 28; opening switch 26 and making diode 24 effective; opening switch 28 and making diode 23 effective. The curve 200 (FIG. 2) is thus completed for the negative half of the cycle as shown.

Figure 2:
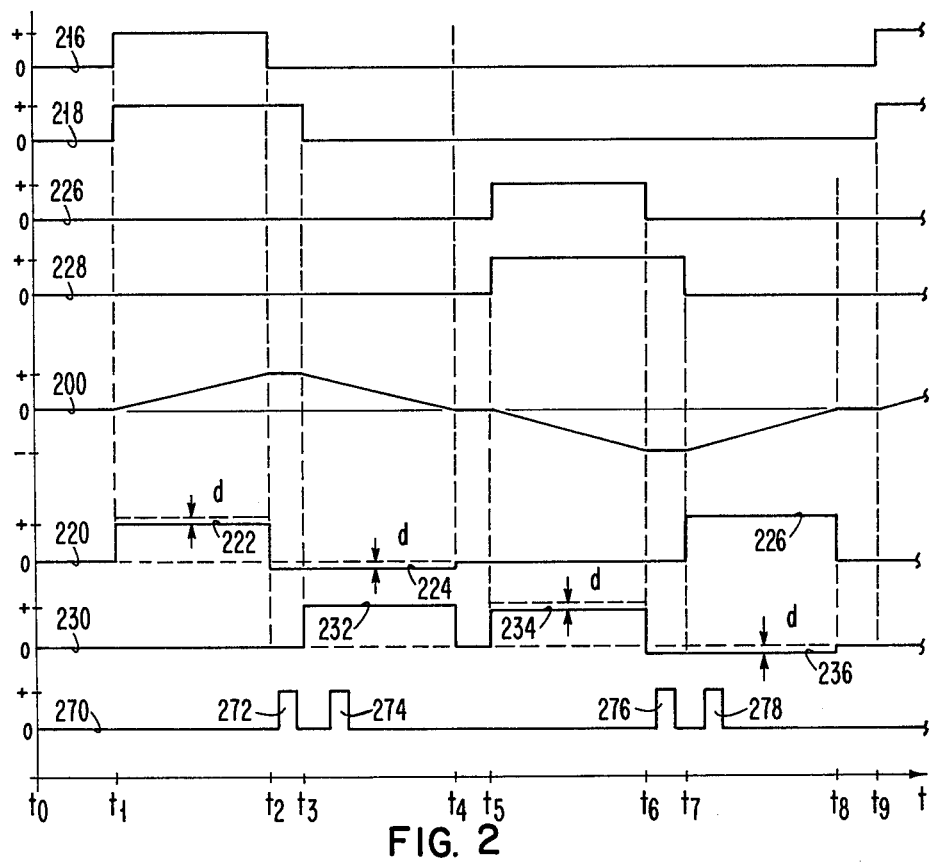
FIG. 2 is a graphical representation of waveforms useful in an understanding of the operation of the electric switching circuitry and the monitoring circuitry according to the invention.

Graphical representations of waveforms useful in an understanding of the invention are shown in FIG. 2.

The curve 200 is a graphical representation of the resultant waveform developed in the exemplary circuit arrangement. Curves 216, 218, 226 and 228 represent the actions of the switches 16, 18, 26 and 28 respectively, while the potentials at the junctions 20 and 30 are represented by the curves 220 and 230 respectively. Thus the switch 16 is closed between the times $t_1$ and $t_2$ and is closed on the next cycle at time $t_9$. The switch 18 is closed between the times $t_1$ and $t_3$ and is closed again at time $t_9$. The curve 270 represents the times of occurrence of test pulses for monitoring the operation of the switches as will be discussed more fully hereinafter.

The current flowing in the inductor 10 increases from zero to a maximum in the time between $t_1$ and $t_2$ and remains essentially constant between the times $t_2$ and $t_3$. Thereafter the current flow decays to zero nearly linearly between the times $t_3$ and $t_4$. Similar action follows during the negative portion of the cycle.

If either switch 16 or 18 remained closed when the switches 26 and 28 are closed, a short circuit will exist across the power supply. Failure of any of the switches 16, 18, 26 or 28 to open may be detected by observing the potentials on the junctions 20 and 30. For example, when switch 16 opens after the coil current has reached a proper maximum value, the potential at the junction 20 should drop to one diode drop, that of the diode 21, below ground. This condition can be checked during the time between times $t_2$ and $t_4$ as shown by curve 216, and preferably between $t_2$ and $t_3$. Similarly, when the switch 18 opens, the potential at the junction 30 should rise to one diode drop, that of diode 22, above the value of the power supply. This condition can be checked during the time between times $t_3$ and $t_4$ as shown on curve 216. The curve 270 represents the appearances of test pulses at the test pulse input terminal 70. The pulse 272 is applied to check the switch 16; the pulse 274 to check two switches 16 and 18; the pulse 276 to check the switch 26; and the pulse 278 to check two switches 26 and 28. A train of pulses 274 and 278 is sufficient for insuring proper operation of all of the switches, while a train of pulses also including pulse 272 and 276 will provide an analysis for determining the failure of any single switch.

Figure 3:
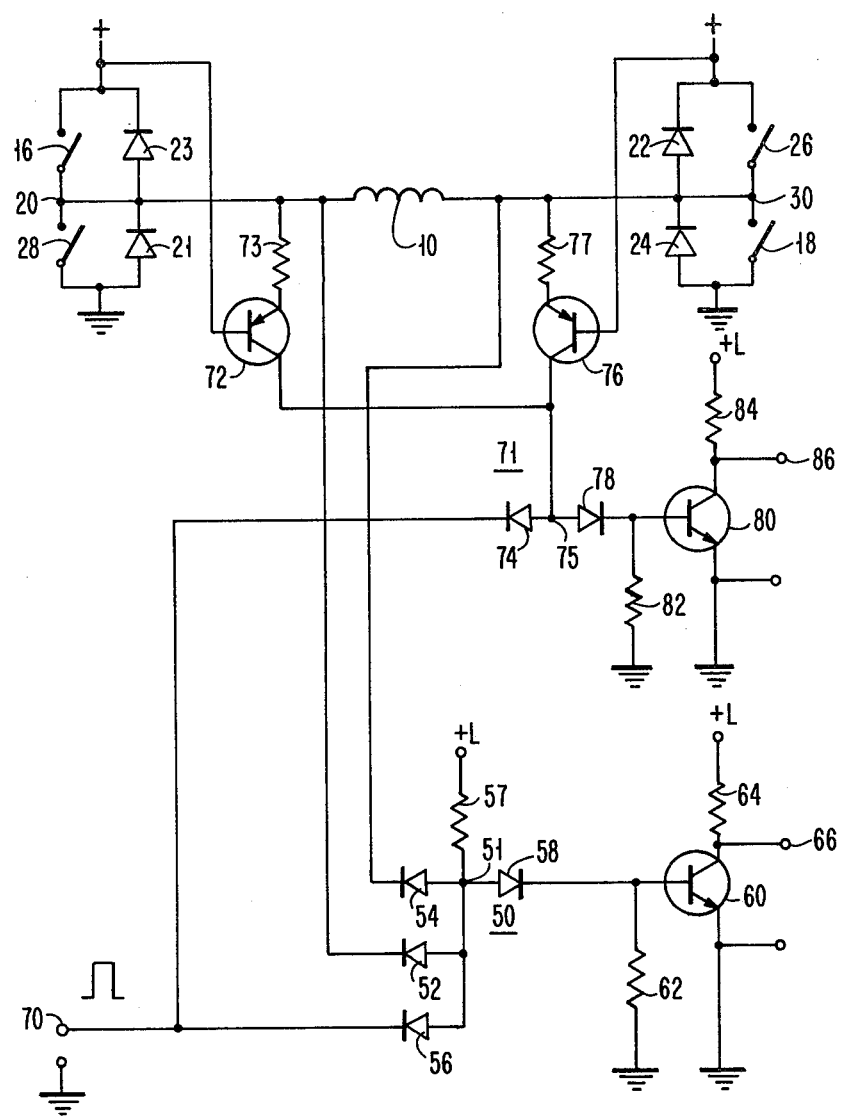
FIG. 3 is a schematic diagram of electric switch operation monitoring circuitry according to the invention.

A circuit arrangement for monitoring the operation of the switches by observing the potentials at the junctions 20 and 30, is shown in FIG. 3. In the interest of clarity, electromechanical switch symbols are used, but it is to be understood clearly that in more cases than not, semiconductor switch devices will be involved. A logical coincidence circuit such as an AND gating circuit 50 as shown here comprises a diode 52 connected to the junction 20, a diode 54 connected to the junction 30, a diode 56 connected to a test pulse wave terminal 70, and a resistor 57 connected to a point of fixed energizing potential. The AND gating circuit 50 is coupled by a diode 58 to the base electrode of a transistor 60. The transistor 60 also has an emitter electrode connected to a base biasing resistor 62 and to a point of fixed reference potential as shown. A collector electrode is connected to a load resistor 64 and to an output terminal 66.

Another coincidence circuit 71 is arranged as shown with active elements as well as inactive elements. A transistor 72 is connected by way of a resistor 73 between the junction 20 and the junction 75 to which a similar transistor 76 is connected by way of a resistor 77 to the junction 30. The junction 75 is connected by a diode 74 leading to the test pulse wave terminal 70. The two transistors 72 and 76 are connected in common by a diode 78 to the base electrode of a transistor 80 having a biasing resistor 82, and a collector load resistor 84 from which a lead is connected to an output terminal 86.

The output terminals 66 and 86 are connected to utilization circuitry (not shown) for sounding alarms, protecting the portion of the overall circuitry that would otherwise be damaged by faulty switch operation, and/or modifying the overall circuitry as applicable. Conventional circuitry for those purposes is known and forms no part of the invention in and of itself.

The monitoring circuitry is made up of conventional logical circuit modules. Those shown in the drawing are energized by a source of direct potential of the order of 5 volts. Logical circuit families of other potential ratings are clearly in order. Usually the bipolar load device is operated from a source of potential of the order of 40 volts, however, the circuitry as shown is arranged for compatible operation with such a difference in potential without adverse effect.

As will appear, the logical circuitry is arranged to operate about a more convenient range of logical level potentials in those applications where commutating or "catch" diodes, 21 . . . 24, are connected across the switches, 16, 18, 26, 28 as shown. When a switch is closed, the impedance across the switch-diode combination is low and the resulting potential drop thereacross is also very low, and in most instances it can be considered to be zero for all practical purposes. When the switch is open the impedance is higher and the potential drop is higher, but in the back direction is limited to a substantially uniform potential drop of 1.4–1.7 volts for most diodes, which potential drop is termed one "diode drop" or "d" for convenience. Referring to FIG. 2, the potentials at the junctions 20 and 30 are seen to differ from the supply + and ground potentials by one "diode drop" d. The portion of curve 220 at 224 is at the nominal supply potential V, which is seen to differ from the portion at 226 which is maintained at a potential V+d. Similarly for curve 230, the portion 232 is at a potential V+d and the portion 234 is at supply potential V. The portion 263 is at a potential d below ground. Likewise, for curve 220 the portion 224 is at a potential below ground.

Proper opening of the switch 16 is verified with coincidence-checking circuitry implemented with the diodes 52, 54, 58 of the transistor 60, and the resistors 57, 62 and 64. If the switch 16 has properly opened, then the voltage at the terminal 70, which is one diode drop below ground, will effect current flow through the resistor 57 and the diode 52. The voltage at the junction 51 is thereby clamped at approximately ground potential, preventing the turn-on of the transistor 60 and its subsequent current through the resistor 64. If a test pulse of positive potential is applied at the test terminal 70, then the diode 56 is reverse biased with no change of voltage at the junction 51 and no current conduction through the resistor 64.

Conversely, if the switch 16 is not completely opened, then the voltage at the node 20 will be at some positive potential such that current through resistor 57 does not flow through the diode 52, but rather through the diode 56. When a test pulse of positive potential is applied at the terminal 70, the potential at the junction 51 is shifted positive, effecting current flow through diode 58, turn-on of the transistor 60 and current flow through the resistor 64. Conduction through the resistor 64 is sensed by subsequent logic circuitry as a failure of the switch 16 to open properly.

Thus, if the collector potential of the transistor 60 and the terminal 66 are at an "up" level when a test pulse is applied at terminal 70, the switch 16 has opened properly. If, however, it fails to open then the potential at the junction 20 is at positive potential and the diode 52 is reverse biased. On the application of a test pulse at the terminal 70, the transistor 60 will be turned on and the potential on the collector electrode and the terminal 66 will be brought to a "down" level indicating a failure of the switch.

Proper opening of the switch 18 is verified with the diodes 74 and 78, the transistors 76 and 80 and the resistors 73, 77, 82. If the switch 18 has properly opened, then the voltage at the node 30 is such as to turn on the transistor 76 causing the diode 74 to conduct. The resistor 77 serves to limit the maximum current flow through the transistor 76. If a test pulse of positive potential is applied at the input terminal 70, then the potential at the node 75 rises to cause the diode 78 to conduct, which turns on the transistor 80 to cause current to flow through the resistor 84.

If the switch 18 is not properly opened, then the potential at the node 30 is insufficient to forward bias the transistor 76 and produce current flow through the diode 74. When a positive test pulse is applied at the terminal 70, the diode 74 becomes reverse biased. There is no current flow through the diode 78. Transistor 80 is not turned on and there is no current flow through the resistor 84. Lack of current flow through resistor 84 is sensed by subsequent logic circuitry as a failure of the switch 18 to open properly.

Thus, the switch 18 is open if a positive test pulse at the test pulse input terminal 70 produces a logical "down" level at the collector electrode of transistor 80 and terminal 86. If however, the switch 18 fails to open properly, the potential at the junction 30 will prevent the transistor 76 from supplying base current to the transistor 80 and the collector electrode and the terminal 86 will remain at the "up" level indicating failure of the switch.

The transistors 60, 72, 76 and 80 may be n-p-n type or p-n-p type as suitable to the artisan where the emitter-base breakdown voltage, typically about 6 volts, is not exceeded. In the example shown, where the supply potential is of the order of 40 volts, the transistors 72 and 76 preferably are of the "lateral p-n-p" type having a $B_vE - B_o$, that is the Breakdown Voltage between the Emitter and the Base with collector Open is of the order of 45 volts.

While the invention has been described in terms of an express embodiment, and alternatives have been suggested, it should be recognized that those skilled in the art will suggest other changes without departing from the spirit and scope of the invention as defined in the appended claims concluding the specification.

The invention claimed is:

1. Operation monitoring circuitry for an electric switching circuit of the type including a bipolar eled device, a source of power having two terminals, one switch connecting one terminal of said source of power to one terminal of said load device, and another switch connecting the other terminal of said source of power to the other terminal of said load device, a further switch connecting said other terminal of said load device to said one terminal of said source of power and an additional switch connecting said one terminal of said load device to said other terminal of said source of power, and a diode shunting each of said switches, comprising test signal input terminals, monitor level output terminals, logical circuitry connected to both terminals of said load device, to said test signal terminal and to said monitor level output terminals, said logical circuitry including coincidence circuits having actuating devices connected to said test signal input circuits, having active devices individual to said output terminals, and having sensing devices individual to both terminals of said load device, all connected for changing the output levels at said output terminals in response to test pulses applied at said input terminals at predetermined times in the switching cycle.

2. Operation monitoring circuitry for an electric switching circuit of the type including a bipolar electric load device, a source of power having two terminals, one switch connecting one terminal of said source of power to one terminal of said load device, and another switch connecting the other terminal of said source of power to the other terminal of said load device, a further switch connecting said other terminal of said load device to said one terminal of said source of power and an additional switch connecting said one terminal of said load device to said other terminal of said source of power, comprising test potential input terminals, a monitor level output terminal, a coincidence circuit having one input lead connected to said one terminal of said load device, having another input lead connected to said other terminal of said load device, having a further input lead connected to said test potential input terminal and having an output terminal, a transistor having an emitter electrode, a collector electrode and a base electrode, a diode coupling said output terminal of said coincidence gating circuit to said base electrode of said transistor, a base biasing resistor connected across the base and emitter electrodes of said transistor, and a load resistor connected to said collector electrode of said transistor and to said output terminal.

3. Operation monitoring circuitry for an electric switching circuit of the type including a bipolar electric load device, a source of power having two terminals, one switch connecting one terminal of said source of power to one terminal of said load device, and another switch connecting the other terminal of said source of power to the other terminal of said load device, a further switch connecting said other terminal of said load device to said one terminal of said source of power and an additional switch connecting said one terminal of said load device to said other terminal of said source of power, comprising a test potential input terminal, a monitor level output terminal, a coincidence circuit having a pair of transistors having collector electrodes connected in common, having base electrodes connected to said one terminal of said source of power and having emitter electrodes.

a pair of resistors individually coupling said emitter electrodes to said one and said other terminal of said load device, a diode connecting said commonly connected collector electrodes to said test potential input terminals, another transistor having an emitter electrode, a collector electrode and a base electrode, a diode coupling said commonly connected collector to said base electrode of said other transistor, a base biasing resistor connected between said base and emitter electrodes of said other transistor, and a load resistor connected to said collector electrode of said other transistor and to said output terminal.

4. Operation monitoring circuitry for an electric switching circuit as defined in claim 3, and wherein said pair of transistors are lateral p-n-p type.

5. Operation monitoring circuitry for an electric switching circuit of the type including a bipolar electric load device, a source of power having two terminals, one switch connecting one terminal of said source of power to one terminal of said load device, and another switch connecting the other terminal of said source of power to the other terminal of said load device, a further switch connecting said other terminal of said load device to said one terminal of said source of power and an additional switch connecting said one terminal of said load device to said other terminal of said source of power, comprising a test potential input terminal, a pair of monitor level output terminals, an AND gating circuit having one input lead connected to said one terminal of said load device, another input lead connected to said other terminal of said load device, a further input lead connected to said test potential input terminal and an output terminal, a transistor having an emitter electrode, a collector electrode and a base electrode, a diode coupling said output terminal of said AND gating circuit to said base electrode of said transistor, a base biasing resistor connected across the base and emitter electrodes of said transistor, a load resistor connected to said collector electrode of said transistor and to one of said output terminals at which an indication of proper operation of said one and said other switches is delivered, another AND gating circuit having a pair of transistors having collector electrodes connected in common, base electrodes connected to said one terminal of said source of power and emitter electrodes, a pair of resistors individually coupling said emitter electrodes to said one and said other terminal of said load device, a diode connecting said commonly connected collector electrodes to said test potential input terminal, another transistor having an emitter electrode, a collector electrode and a base electrode, a diode coupling said commonly connected collector to said base electrode of said other transistor, a base biasing resistor connected between said base and emitter electrodes of said other transistor, and a load resistor connected to said collector electrode of said other transistor and to the other of said output terminals at which an indication of proper operation of said further and said additional switches is delivered.

6. Operation monitoring circuitry for an electric switching circuit as defined in claim 5, and wherein said load device is an inductor.

7. Operation monitoring circuitry for an electric switching circuit as defined in claim 6, and incorporating a diode connected across each of said switches.

* * * * *